United States Patent
Kado et al.

(10) Patent No.: US 9,530,642 B2
(45) Date of Patent: Dec. 27, 2016

(54) METHOD FOR PRODUCING SIC SINGLE CRYSTAL

(71) Applicants: TOYOTA JIDOSHA KABUSHIKI KAISHA, Toyota-shi, Aichi (JP); NIPPON STEEL & SUMITOMO METAL CORPORATION, Tokyo (JP)

(72) Inventors: Motohisa Kado, Gotenba (JP); Kazuhiko Kusunoki, Tokyo (JP); Kazuhito Kamei, Tokyo (JP)

(73) Assignees: TOYOTA JIDOSHA KABUSHIKI KAISHA, Toyota (JP); NIPPON STEEL & SUMITOMO METAL CORPORATION, Tokyo (JP)

( * ) Notice: Subject to any disclaimer, the term of this patent is extended or adjusted under 35 U.S.C. 154(b) by 116 days.

(21) Appl. No.: 14/420,984

(22) PCT Filed: Aug. 12, 2013

(86) PCT No.: PCT/JP2013/071812
§ 371 (c)(1),
(2) Date: Feb. 11, 2015

(87) PCT Pub. No.: WO2014/034424
PCT Pub. Date: Mar. 6, 2014

(65) Prior Publication Data
US 2015/0221511 A1   Aug. 6, 2015

(30) Foreign Application Priority Data
Aug. 30, 2012   (JP) ................. 2012-190547

(51) Int. Cl.
C30B 9/04 (2006.01)
H01L 21/02 (2006.01)
(Continued)

(52) U.S. Cl.
CPC .......... *H01L 21/02628* (2013.01); *C30B 9/06* (2013.01); *C30B 17/00* (2013.01); *C30B 29/36* (2013.01);
(Continued)

(58) Field of Classification Search
CPC ............... C30B 9/00; C30B 9/04; C30B 9/06; C30B 15/00; C30B 15/14; C30B 15/20; C30B 15/22; C30B 17/00; C30B 19/00; C30B 19/02; C30B 19/08; C30B 29/00; C30B 29/10; C30B 29/36; H01L 21/02529; H01L 21/02598; H01L 21/02628
(Continued)

(56) References Cited

U.S. PATENT DOCUMENTS

2009/0101062 A1   4/2009  Sakamoto
2009/0178610 A1   7/2009  Sakamoto et al.
(Continued)

FOREIGN PATENT DOCUMENTS

CN   101473074 A   1/2009
CN   101932757 A   12/2010
(Continued)

*Primary Examiner* — Kenneth A Bratland, Jr.
(74) *Attorney, Agent, or Firm* — Oliff PLC

(57) ABSTRACT

Provided is a method for producing an SiC single crystal, which is capable of greatly increasing the growth rate in a solution technique in comparison to conventional methods. A method for producing an SiC single crystal, wherein an SiC single crystal is grown by bringing a seed crystal substrate into contact with an Si—C solution that is put in a crucible and has a temperature gradient decreasing from the inside to the liquid level, and wherein the value of depth/inner diameter of the crucible is less than 1.71 and the
(Continued)

temperature gradient of the Si—C solution from the liquid level to 10 mm below the liquid level is larger than 42° C./cm.

6 Claims, 7 Drawing Sheets

(51) Int. Cl.
    *C30B 29/36* (2006.01)
    *C30B 17/00* (2006.01)
    *C30B 9/06* (2006.01)

(52) U.S. Cl.
    CPC ... *H01L 21/02529* (2013.01); *H01L 21/02598* (2013.01)

(58) Field of Classification Search
    USPC .......... 117/11, 13–15, 30, 54, 64–65, 73–74, 117/937, 951
    See application file for complete search history.

(56) References Cited

U.S. PATENT DOCUMENTS

| | | | |
|---|---|---|---|
| 2010/0308344 | A1 | 12/2010 | Seki et al. |
| 2012/0304916 | A1 | 12/2012 | Ishii |
| 2015/0013590 | A1* | 1/2015 | Kado ...................... C30B 29/36 117/60 |

FOREIGN PATENT DOCUMENTS

| | | | | |
|---|---|---|---|---|
| JP | 2005-082435 | A | | 3/2005 |
| JP | 2006-347852 | A | | 12/2006 |
| JP | 2007-076986 | A | * | 3/2007 |
| JP | 2009-091222 | A | | 4/2009 |
| JP | 2011168447 | A | | 9/2011 |
| JP | 4853449 | B2 | | 1/2012 |
| WO | 2011/101727 | A1 | | 8/2011 |

* cited by examiner

METHOD FOR PRODUCING SIC SINGLE CRYSTAL

TECHNICAL FIELD

The present invention relates to a method for producing a SiC single crystal that is suitable as a semiconductor element.

BACKGROUND ART

SiC single crystals are thermally and chemically very stable, superior in mechanical strengths, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are being considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

Typical processes for growing SiC single crystals that are known in the prior art include gas phase processes, the Acheson process and solution processes. Among gas phase processes, for example, sublimation processes have a drawback in that grown single crystals have been prone to hollow penetrating defects known as "micropipe defects", lattice defects, such as stacking faults, and generation of polymorphic crystals. However, most SiC bulk single crystals are conventionally produced by sublimation processes because of the high crystal growth rate, with attempts being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is formed in a graphite crucible and C is dissolved from the graphite crucible into the molten liquid, and a SiC crystal layer is deposited and grown on a seed crystal substrate set in the low temperature section. Solution processes are most promising for reducing defects since crystal growth is carried out in a state of near thermal equilibrium, compared to gas phase processes. Recently, therefore, methods for producing SiC single crystals by solution processes have been proposed.

For example, there has been disclosed a method for producing a SiC single crystal in which the temperature gradient of the Si—C solution near the seed crystal substrate is limited to no higher than 5° C./cm, in order to obtain SiC single crystals with few defects (PTL 1).

CITATION LIST

Patent Literature

[PTL 1] Japanese Unexamined Patent Publication No. 2009-91222

SUMMARY OF THE INVENTION

Problems to be Solved by the Invention

In solution processes, therefore, while it is easy to obtain a SiC single crystal with fewer defects than other processes, conventional methods, such as the one described in PTL 1, have a problem of a slow growth rate of SiC single crystals.

It is an object of the present invention to solve this problem, and to provide a method for producing a SiC single crystal by a solution process that can substantially improve growth rates over the prior art.

Means for Solving the Problems

The present invention is a method for producing a SiC single crystal in which a seed crystal substrate is contacted with a Si—C solution placed in a crucible and having a temperature gradient such that the temperature decreases from the interior toward the liquid surface level to cause crystal growth of the SIC single crystal, wherein:

the depth/inner diameter ratio of the crucible is less than 1.71, and the temperature gradient in the range from the liquid surface level of the Si—C solution to 10 mm below the liquid surface level is greater than 42° C./cm.

Effect of the Invention

According to the invention it is possible to grow a SiC single crystal at a significantly higher growth rate than the prior art.

DESCRIPTION OF EMBODIMENTS

Figure 1:
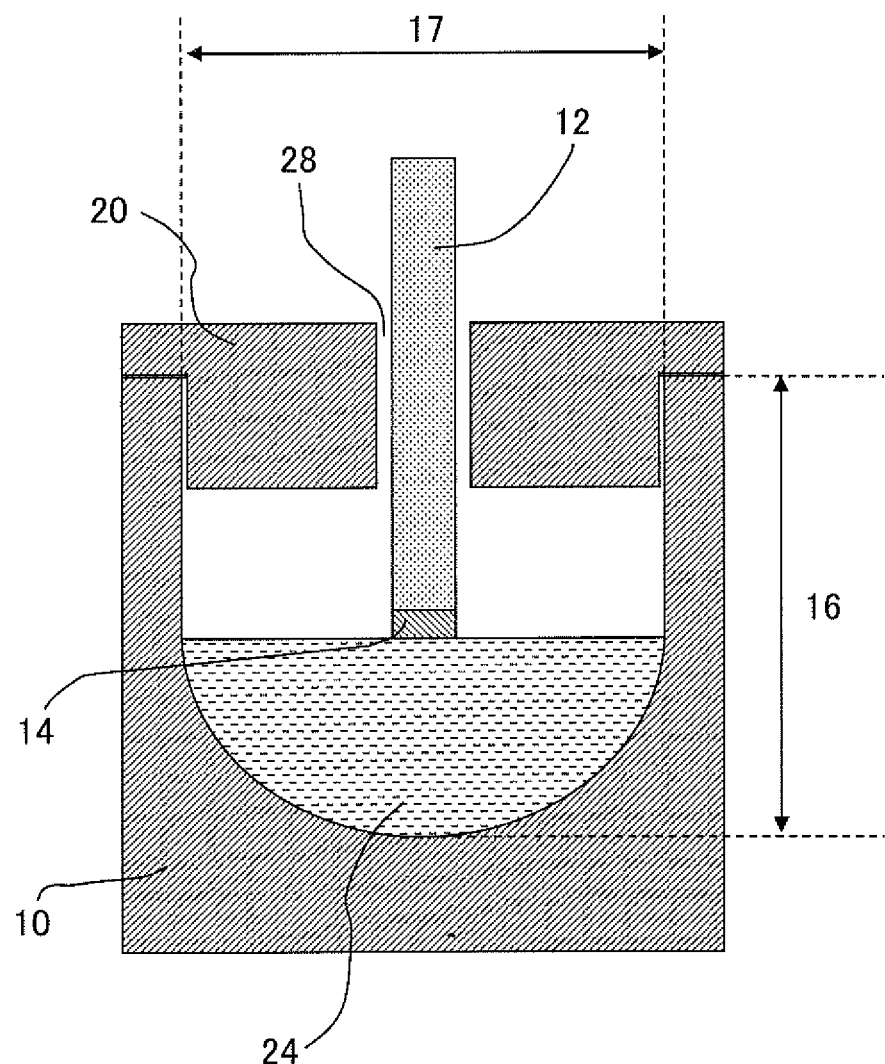
FIG. 1 is a cross-sectional schematic drawing of a crucible structure that can be used in the method of the invention.

Throughout the present specification, the indication "−1" in an expression, such as "(000-1) face", is used where normally a transverse line is placed over the numeral.

Growth of a SiC single crystal by a conventional solution process can be expected to take place with low defects since crystal growth is in a state of nearly thermal equilibrium, but the overall growth rate is slow and it has been difficult to obtain desired growth rates.

The present inventors have conducted diligent research on increasing growth rates for SiC single crystal growth, and have discovered a method for producing a SiC single crystal that allows the growth rate to be significantly increased.

The invention is a method for producing a SiC single crystal in which a seed crystal substrate is contacted with a Si—C solution that is placed in a crucible and has a temperature gradient such that the temperature decreases from the interior toward the liquid surface level to cause crystal growth of the SiC single crystal, wherein the temperature gradient in the range from the liquid surface level of the Si—C solution to 10 mm below the liquid surface level is greater than 42° C./cm.

According to the invention, the temperature gradient in the range from the liquid surface level of the Si—C solution to 10 mm below (hereunder referred to as "temperature gradient in the surface region of the Si—C solution" or "temperature gradient") is greater than 42° C./cm, thereby allowing the growth rate of the SiC single crystal to be significantly increased over the prior art.

The method of the invention is a method for producing a SiC single crystal by a solution process, and it allows growth of a SiC single crystal by contact of a SiC seed crystal with a Si—C solution having a temperature gradient such that the temperature decreases from the interior toward the surface. By forming a temperature gradient in which the temperature decreases from the interior of the Si—C solution toward the liquid surface level of the solution, the surface region of the Si—C solution becomes supersaturated and a SiC single crystal is grown from the seed crystal substrate contacting with the Si—C solution.

In the invention, the temperature gradient in the surface region of the Si—C solution is greater than 42° C./cm, and it is preferably 47° C./cm or greater, more preferably 50° C./cm or greater and even more preferably 57° C./cm or greater. In these temperature gradient ranges it is possible to obtain a very high SiC single crystal growth rate.

There is no particular restriction on the upper limit of the temperature gradient, but the temperature gradient that can be actually formed may substantially be the upper limit, and it may be about 70° C./cm, for example.

The temperature gradient in the surface region of the Si—C solution can be formed by adjusting the output of the heater, such as a high-frequency coil, situated around the crucible, by adjusting the positional relationship between the crucible and the high-frequency coil, or by radiation heat loss from the surface of the Si—C solution or heat loss through the seed crystal holding shaft. Especially in order to form a large temperature gradient, it was found to be effective to decrease the crucible depth or increase the crucible inner diameter, or both.

FIG. 1 is a cross-sectional schematic drawing of a crucible structure that can be used in the method of the invention. A graphite crucible 10 holds a Si—C solution 24 inside it, and a seed crystal holding shaft 12 holding a seed crystal substrate 14 can be inserted through an opening 28 formed in the cover 20 at the top of the crucible. As shown in FIG. 1, the crucible depth 16 is the length from the bottom of the crucible holding the Si—C solution up to the top edge of the side wall of the crucible, and the side wall sections are heated by a heater situated surrounding the crucible. Also as shown in FIG. 1, the crucible inner diameter 17 is the inner diameter of the crucible holding the Si—C solution.

Figure 2:
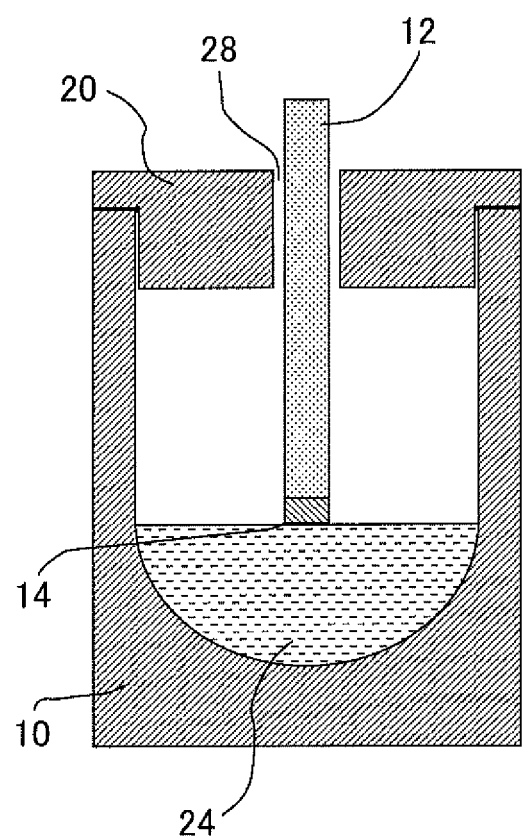
FIG. 2 is a cross-sectional schematic drawing of a crucible structure having a increased crucible depth.
Figure 3:
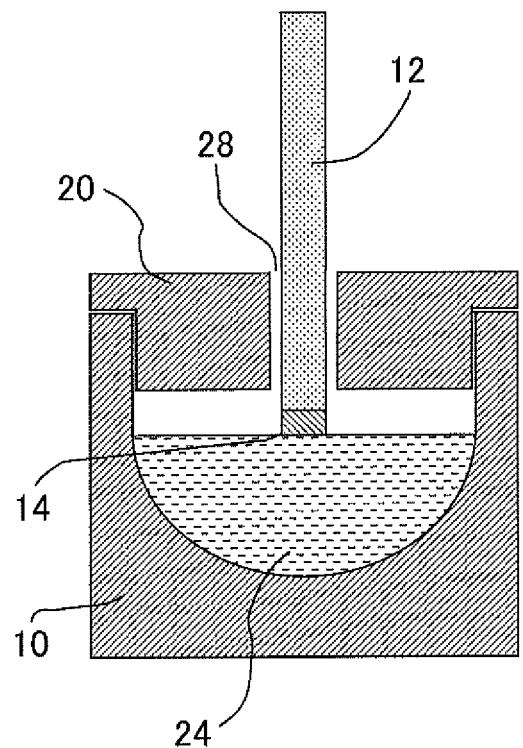
FIG. 3 is a cross-sectional schematic drawing of a crucible structure having a decreased crucible depth.

For example, if the crucible depth is increased as shown in FIG. 2, it will be difficult to form a large temperature gradient. If the crucible depth is decreased as shown in FIG. 3, it will be easy to form a large temperature gradient. Similarly for the crucible inner diameter, if crucible inner diameter is decreased it will become difficult to form a large temperature gradient, but if the crucible inner diameter is increased it will become easy to form a large temperature gradient.

While it is not our intention to be constrained by theory, it is assumed that when the crucible depth 16 is decreased, the distance between the liquid surface level of the Si—C solution 24 and the cover 20 at the top of the crucible is narrowed and the effect of heat loss from the cover 20 at the top of the crucible can be increased, thereby increasing the temperature gradient in the surface region of the Si—C solution 24. It is also assumed that when the crucible inner diameter 17 is increased, the seed crystal substrate is more distant from the side walls of the crucible that is heated with the heater, thus tending to cause temperature reduction around the seed crystal substrate and increasing the temperature gradient in the surface region of the Si—C solution 24.

The dimensional proportion of the crucible depth/crucible inner diameter is preferably less than 1.71 and more preferably no greater than 1.14. Using a crucible having a dimensional proportion for the crucible depth/crucible inner diameter within the aforementioned range will help increase the temperature gradient in the surface region of the Si—C solution.

Thus, a smaller dimensional proportion of the crucible depth/crucible inner diameter facilitates increase in the temperature gradient. From this viewpoint there is no particular restriction on the lower limit for the dimensional proportion of the crucible depth/crucible inner diameter. The lower limit for the dimensional proportion of the crucible depth/crucible inner diameter may be a range that allows stable growth of a SiC single crystal, and for example, a SiC single crystal can be stably grown if the proportion of the crucible depth/crucible inner diameter is 0.3 or greater.

Moreover, surprisingly, a smaller dimensional proportion of the crucible depth/crucible inner diameter allows the SiC single crystal growth rate to be increased even if the temperature gradient in the surface region of the Si—C solution is the same.

In order to obtain a high-quality SiC single crystal with a high crystal growth rate while also minimizing generation of defects, such as inclusions and threading dislocations, it is effective to create a flow of the Si—C solution from the center section directly below the interface with the crystal growth surface to the outer peripheral section, so as to inhibit pooling of the Si—C solution.

As used herein, "inclusions" refers to components of the Si—C solution used for SiC single crystal growth incorporated into the grown crystal. When inclusions are generated in a grown crystal, solvent components, such as Cr or Ni that may be present in the solvent used as the Si—C solution, may be detected as the inclusions.

By creating a flow of the Si—C solution from the center section to the outer peripheral section directly below the crystal growth surface interface, it is possible to stably supply solute to the entire growth interface including the outer peripheral section while supplying solute to the crystal growth surface, and to obtain a SiC single crystal having a threading dislocation density equivalent to that of the seed crystal substrate, and containing no inclusions.

Flow of the Si—C solution from the center section to the outer peripheral section directly below the interface with the crystal growth surface can be performed by causing the Si—C solution to flow from the depth of the Si—C solution toward the crystal growth surface, and further causing the Si—C solution to flow from the center section to the outer peripheral section, creating a flow such that the Si—C solution circulates from the outer peripheral section to the depth, by using mechanical stirring of the Si—C solution or by electrical magnetic stirring using high-frequency heating.

The preferred method for creating a flow of the Si—C solution from the center section directly below the crystal growth surface interface to the outer peripheral section is, for example, a method in which the seed crystal substrate is rotated continuously in a fixed direction at a prescribed speed for at least a prescribed time.

By rotating the seed crystal substrate continuously in a fixed direction at a prescribed speed for at least a prescribed period of time, it is possible to promote flow of the Si—C solution directly below the crystal growth interface, and in particular to eliminate stagnated flow sections of the Si—C solution at the outer peripheral sections, minimize incorporation of solution (inclusions) at the outer peripheral sections, and produce growth of a SiC single crystal having threading dislocation density equivalent to that of the seed crystal substrate.

Throughout the present specification, the rotational speed of the seed crystal substrate is the speed at the outermost periphery of the growth surface (bottom face) of the seed crystal substrate (also referred to herein as the outer peripheral section or outermost periphery of the seed crystal substrate). The speed at the outer peripheral section of the seed crystal substrate is preferably a speed that is greater than 25 mm/sec, more preferably at least 45 mm/sec and even more preferably at least 63 mm/sec. Limiting the speed at the outer peripheral section of the seed crystal substrate to within the aforementioned range will make it easier to minimize inclusions and minimize generation of threading dislocations.

When the speed at the outer peripheral section of the seed crystal substrate is controlled to grow the SiC single crystal, the grown crystal will usually grow so as to have the same diameter or an enlarged diameter with respect to the growth surface of the seed crystal substrate, and therefore the rotational speed at the outer peripheral section of the grown crystal will be the same as or greater than the speed at the outer peripheral section of the seed crystal substrate. Thus, controlling the speed at the outer peripheral section of the seed crystal substrate to within the aforementioned range allows flow of the Si—C solution to continue directly below the grown crystal even when crystal growth has proceeded.

The speed at the outer peripheral section of the grown crystal may also be controlled to within the aforementioned speed range, instead of controlling the speed at the outer peripheral section of the seed crystal substrate. As growth of the SiC single crystal proceeds, the grown crystal generally grows in a manner such that its diameter is the same or an enlarged diameter with respect to the growth surface of the seed crystal substrate, resulting in an increasing speed at the outer peripheral section of the grown crystal. In that case, the revolutions per minute (rpm) may be maintained, or the revolutions per minute (rpm) may be reduced so that the speed at the outer peripheral section of the grown crystal is constant.

When the rotational direction of the seed crystal substrate is periodically switched, setting the time of rotation of the seed crystal substrate in the same direction (the rotation holding time) to be longer than a prescribed time period can stabilize the solution flow and minimize incorporation of the solution into the outer peripheral sections.

By periodically changing the rotational direction of the seed crystal substrate, it is possible to grow a concentric SiC single crystal, and to minimize generation of defects that may be generated in the grown crystal. In that case, by keeping rotation in the same direction for a prescribed period of time or longer, it is possible to stabilize flow of the Si—C solution directly below the crystal growth interface. If the rotation holding time is too short, switching of the rotational direction will become too frequent, and this may render flow of the Si—C solution insufficient or unstable.

When the rotational direction of the seed crystal substrate is periodically changed, the rotation holding time in the same direction is preferably longer than 30 seconds, more preferably 200 seconds or longer and even more preferably 360 seconds or longer. Limiting the rotation holding time in the same direction of the seed crystal substrate to within the aforementioned range will make it even easier to minimize inclusions and generation of threading dislocations.

When the rotational direction of the seed crystal substrate is periodically changed, a shorter time for the stopping time of the seed crystal substrate during switching of the rotational direction in the reverse direction is desired, and it is preferably no greater than 10 seconds, more preferably no greater than 5 seconds, even more preferably no greater than 1 second and yet more preferably substantially 0 seconds.

During growth of a SiC single crystal, it is preferred to cause crystal growth while forming a meniscus between the seed crystal substrate and the Si—C solution.

Figure 4:
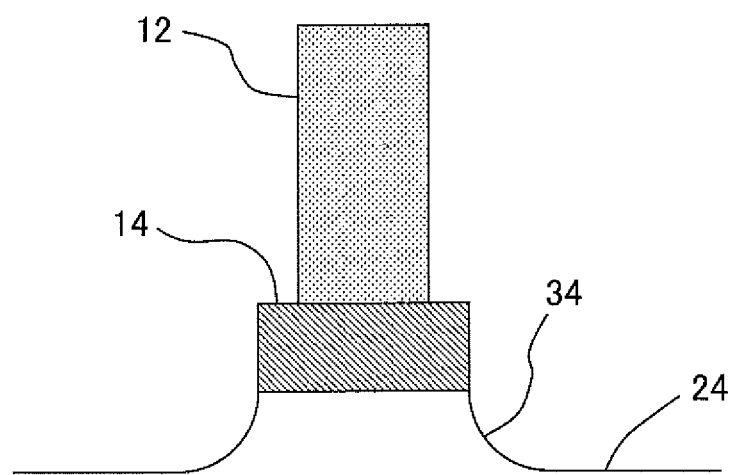
FIG. 4 is a cross-sectional schematic drawing of a meniscus formed between a seed crystal substrate and a Si—C solution.

As used herein, "meniscus" refers to a concave curved surface 34 formed on the surface of the Si—C solution 24 raised by surface tension upon wetting of the seed crystal substrate 14, as shown in FIG. 4. It is possible to grow a SiC single crystal while forming a meniscus between the seed crystal substrate and the Si—C solution. To form a meniscus, for example, after the seed crystal substrate has been contacted with the Si—C solution, the seed crystal substrate may be raised and held at a position where the bottom face of the seed crystal substrate is higher than the liquid surface level of the Si—C solution.

Since the meniscus portion formed on the outer peripheral section of the growth interface is at a lower temperature due to radiation heat loss, formation of the meniscus can create a temperature gradient in which the temperature of the Si—C solution is lower at the outer peripheral section than at the center section directly below the interface with the crystal growth plane. This can increase the degree of supersaturation of the Si—C solution at the outer peripheral section of the growth interface, so that it is greater than the degree of supersaturation of the Si—C solution at the center section of the growth interface.

By thus forming a gradient for the degree of supersaturation in the horizontal direction within the Si—C solution directly below the crystal growth interface, a SiC crystal can be grown having a concave crystal growth plane. This allows crystal growth to be performed without the crystal growth plane of the SiC single crystal being on the exact plane, and can help to more easily minimize generation of inclusions and threading dislocations.

The method of examining inclusions is not particularly restricted, and as shown in FIG. 5(a), the grown crystal 40 may be sliced parallel to the growth direction to cut a grown crystal 42 as shown in FIG. 5(b), and observation may be made of whether or not the entire surface of the grown crystal 42 is a continuous crystal based on a transmission image, to allow examination of the presence of inclusions. The grown crystal may be sliced perpendicular to the growth direction, and the presence of inclusions in the cut grown crystal may be examined by the same method. Also, the grown crystal may be cut out as described above and subjected to energy dispersive X-ray spectroscopy (EDX) or wavelength dispersive X-ray analysis (WDX) for qualitative analysis or quantitative analysis of the Si—C solution, component in the cut out grown crystal, to allow detection of inclusions.

By observation of the transmission image, since visible light is not transmitted at the sections where inclusions are present, the sections where visible light is not transmitted may be detected as inclusions. According to elemental analysis by EDX or WDX, when a Si/Cr-based solvent or Si/Cr/Ni-based solvent is used as the Si—C solution, for example, it is analyzed whether solvent components other than Si and C, such as Cr or Ni, are present in the grown crystal, and the solvent components other than Si and C, such as Cr or Ni, can be detected as inclusions.

The presence or absence of threading dislocations in the grown crystal can be evaluated by mirror polishing so as to expose the (0001) plane, and performing molten alkali etching using molten potassium hydroxide, sodium peroxide or the like to accentuate the dislocations, and observing the etch pits on the surface of the SiC single crystal with a microscope.

In this method, a SiC single crystal having quality commonly used for production of SiC single crystals may be used as the seed crystal substrate. For example, a SiC single crystal formed in the common manner by a sublimation process may be used as the seed crystal substrate.

For example, it is possible to use as the seed crystal substrate a SiC single crystal with the growth surface which is flat and a (0001) just plane or (000-1) just plane, or a SiC single crystal with the growth surface having an offset angle of greater than 0° and no greater than 8°, from the (0001) just plane or (000-1) just plane.

When performing crystal growth of a SIC single crystal by rotating the seed crystal substrate continuously in a fixed direction at a prescribed speed for at least a prescribed time while forming a meniscus, as in the method described above, it is preferred to use a SiC single crystal having a growth surface which is flat and a (0001) just plane or (000-1) just plane.

A SiC single crystal formed in a common manner by a sublimation process generally contains numerous threading dislocations including threading screw dislocations and threading edge dislocations, but the seed crystal substrate used for the invention may contain or not contain threading dislocations.

When performing crystal growth of a SiC single crystal by rotating the seed crystal substrate continuously in a fixed direction at a prescribed speed for at least a prescribed time while forming a meniscus, as in the method described above, it is possible to perform growth of a SiC single crystal having a threading dislocation density equivalent to that of the seed crystal substrate. Therefore, since using a SiC single crystal with low threading dislocation density as the seed crystal substrate allows growth of a SiC single crystal containing a low threading dislocation density or containing no threading dislocations, the SiC single crystal used as the seed crystal substrate preferably has a low threading dislocation density or no threading dislocations.

The overall shape of the seed crystal substrate may be any desired shape, such as plate-like, discoid, cylindrical, columnar, truncated conic or truncated pyramidal.

Placement of the seed crystal substrate in the single crystal production apparatus may be performed by holding the top face of the seed crystal substrate on the seed crystal holding shaft using an adhesive or the like.

Contact of the seed crystal substrate with the Si—C solution may be performed by lowering the seed crystal holding shaft holding the seed crystal substrate toward the Si—C liquid surface level, and contacting it with the Si—C solution while the bottom face of the seed crystal substrate is parallel to the Si—C solution surface. The seed crystal substrate may be held at a prescribed position relative to the Si--C solution surface for growth of the SiC single crystal.

The holding position of the seed crystal substrate may be such that the position of the bottom face of the seed crystal substrate matches the Si—C solution surface, or is below the Si—C solution surface, or is above the Si—C solution surface. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. The position of the bottom face of the seed crystal substrate may match the Si—C solution surface or be lower than the Si—C solution surface, but it is preferred to perform crystal growth by holding the bottom face of the seed crystal substrate at a position above the Si—C solution surface in order to form a meniscus as described above. In order to prevent generation of polycrystals, preferably the Si—C solution is not contacted with the seed crystal holding shaft. In such methods, the position of the seed crystal substrate may be adjusted during crystal growth.

The seed crystal holding shaft may be a graphite shaft holding the seed crystal substrate at one end face. The seed crystal holding shaft may have any desired shape, such as cylindrical or columnar, and there may be used a graphite shaft having the same end face shape as the top face of the seed crystal substrate.

As used herein, a Si—C solution is a solution in which C is dissolved, where the solvent is a molten liquid of Si or Si/X (X is one or more metals other than Si). X is not particularly restricted so long as it is one or more metals and can form a liquid phase (solution) that is in a state of thermodynamic equilibrium with SiC (solid phase). Suitable examples of X metals include Ti, Mn, Cr, Ni, Ce, Co, V and Fe.

The Si—C solution is preferably a Si—C solution wherein the solvent is a molten liquid of Si/Cr/X (where X represents one or more metals other than Si and Cr). A Si—C solution wherein the solvent is a molten liquid with an atomic composition percentage of Si/Cr/X=30-80/20-60/0-10, has low variation in C dissolution and is therefore preferred. For example, Cr, Ni and the like may be loaded into the crucible in addition to Si, to form a Si—Cr solution, Si—Cr—Ni solution or the like.

The Si—C solution preferably has a surface temperature of 1800° C. to 2200° C., which will minimize fluctuation in the amount of dissolution of C into the Si—C solution.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Figure 6:
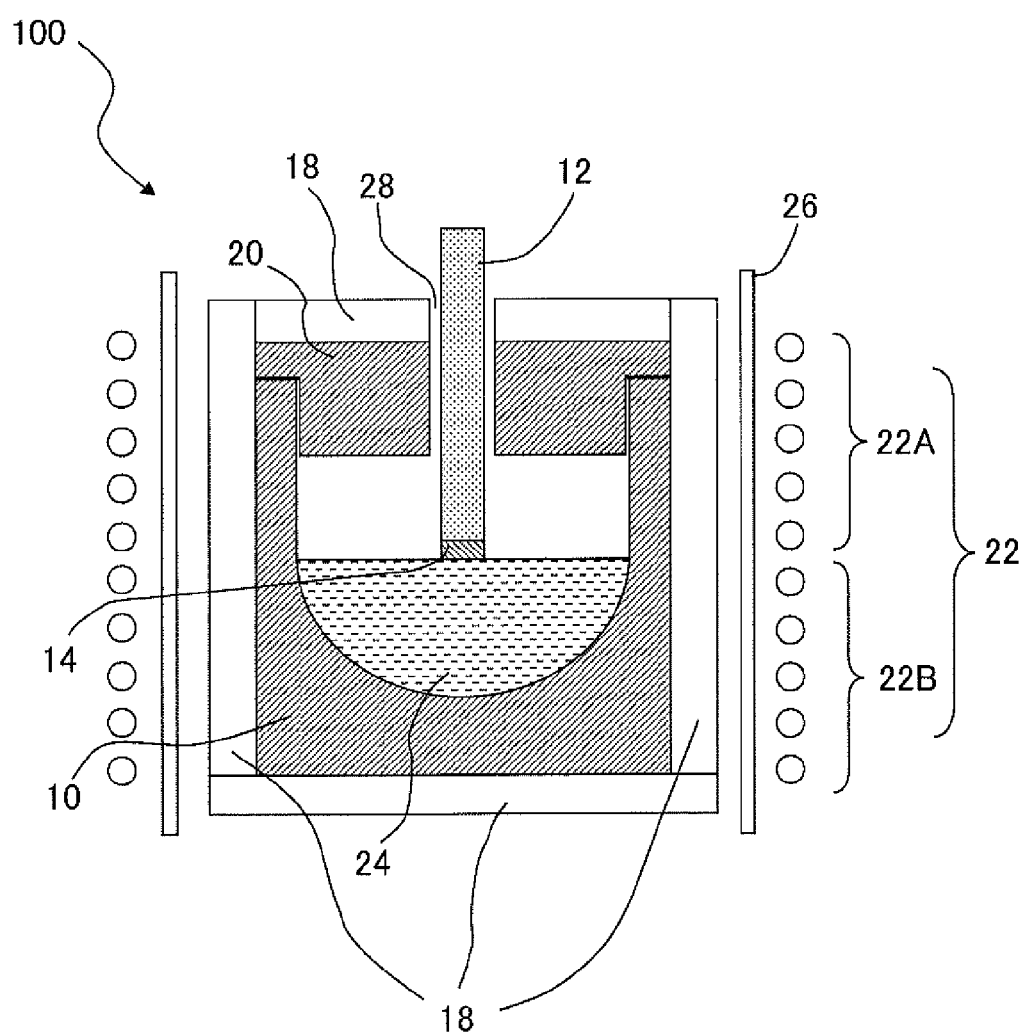
FIG. 6 is a cross-sectional schematic drawing showing an example of a single crystal production apparatus that can be used in the invention.

FIG. 6 shows an example of a SiC single crystal production apparatus for carrying out the invention. The illustrated SiC single crystal production apparatus 100 comprises a crucible 10, wherein the crucible 10 receives a Si—C solution 24 having C dissolved in a molten liquid of Si or Si/X, a temperature gradient is formed in which the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal from the seed crystal substrate 14.

The Si—C solution 24 is prepared by loading the starting materials into the crucible, melting them by heating to prepare Si or Si/X molten liquid, and dissolving C therein. If the crucible 10 is a carbonaceous crucible, such as a graphite crucible, or SiC crucible, C will dissolve into the molten liquid by dissolution of the crucible 10, thereby allowing a Si—C solution to be formed. This will avoid the presence of undissolved C in the Si—C solution 24, and prevent waste of SiC by deposition of the SiC single crystal onto the undissolved C. The supply of C may be performed by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B are independently controllable.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus.

The crucible 10 has an opening 28 at the top through which the seed crystal holding shaft 12 passes. By adjusting the gap (spacing) between the crucible 10 and the seed crystal holding shaft 12 at the opening 28, it is possible to vary the amount of radiation heat loss from the surface of the Si—C solution 24. Although it is usually necessary to keep the interior of the crucible 10 at high temperature, setting a large gap between the crucible 10 and the seed crystal holding shaft 12 at the opening 28 can increase radiation heat loss from the surface of the Si—C solution 24, while setting a small gap between the crucible 10 and the seed crystal holding shaft 12 at the opening 28 can reduce radiation heat loss from the surface of the Si—C solution 24. The gap (spacing) between the crucible 10 and the seed crystal holding shaft 12 at the opening 28 is preferably 1 to 5 mm and more preferably 3 to 4 mm. When a meniscus has formed, radiation heat loss can take place from the meniscus portion as well.

The C that has dissolved in the Si—C solution 24 is dispersed by diffusion and convection. In the region near the bottom face of the seed crystal substrate 14, a temperature gradient can be formed so that it is at lower temperature than the interior of the Si—C solution 24, due to control of output from a heating device, such as a high-frequency coil, heat loss from the surface of the Si—C solution 24 and heat loss through the seed crystal holding shaft 12. When the C that has dissolved into the solution interior that is at high temperature and has high solubility reaches the region near the seed crystal substrate that is at low temperature and has low solubility, a supersaturated state appears and a SiC single crystal is grown on the seed crystal substrate 14 by virtue of supersaturation as a driving force.

In some embodiments, meltback may be carried out in which the surface layer of the seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on the processed conditions of the surface of a seed crystal substrate, it is preferably about 5 to 50 μm for sufficient removal of an affected layer and a natural oxide film.

The meltback may be performed by forming in the Si—C solution a temperature gradient in which the temperature increases from the interior of the Si—C solution toward the surface of the solution, i.e., by forming a temperature gradient in a direction opposite to the case of the SiC single crystal growth. The temperature gradient in the opposite direction can be formed by controlling the output of the high-frequency coil.

The meltback can also be performed without forming a temperature gradient in the Si—C solution, by simply immersing the seed crystal substrate in the Si—C solution that has been heated to a temperature higher than the liquidus temperature. In that case, the dissolution rate increases with higher Si—C solution temperature, but control of the amount of dissolution becomes difficult, while a low temperature may slow the dissolution rate.

In some embodiments, the seed crystal substrate may be preheated in advance, and then the same is contacted with the Si—C solution. If the seed crystal substrate at a low temperature is contacted with the Si—C solution at high temperature, heat shock dislocation may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In that case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocations and growing a high-quality SiC single crystal.

EXAMPLES

Example 1-1

The single crystal production apparatus 100 shown in FIG. 6 was used for growth of a SiC single crystal. In a graphite crucible 10 with a depth of 80 mm and an inner diameter of 70 mm (crucible depth/crucible inner diameter=1.14) holding a Si—C solution 24, in which Si/Cr/Ni in an atomic compositional ratio of 54:40:6 was charged, as a molten liquid starting material. The air in the single crystal production apparatus was exchanged with argon. A high-frequency coil 22 situated around the periphery of the graphite crucible 10 was electrified to melt the starting material in the graphite crucible 10 by heating, thereby forming a Si/Cr/Ni alloy molten liquid. A sufficient amount of C was dissolved into the Si/Cr/Ni alloy molten liquid from the graphite crucible 10 to form a Si—C solution 24.

The outputs of the upper level coil 22A and lower level coil 22B were adjusted to heat the graphite crucible 10, forming a temperature gradient in which the temperature decreased from the interior of the Si—C solution 24 toward the liquid surface level of the solution. The vertical position of the crucible was varied with respect to the center of heat release of the high-frequency coil 22 and the temperature gradient was measured, and then the crucible was placed at the position where the temperature gradient was maximum. Measurement of the temperature gradient was carried out by measuring the temperature of the Si—C solution 24 by using a vertically movable thermocouple. The temperature at the surface of the Si—C solution 24 was 2000° C., the liquid surface level of the Si—C solution was at the low-temperature end, and the temperature difference was 57° C. between the temperature at the liquid surface level of the Si—C solution 24 and the temperature at the position of 10 mm depth in the vertical direction from the liquid surface level of the Si—C solution 24 toward the solution interior, forming a temperature gradient of 57° C./cm.

A cylindrical graphite seed crystal holding shaft 12 with a diameter of 12 mm and a length of 200 mm was prepared. As the seed crystal substrate 14 there was prepared a discoid 4H—SiC single crystal with a thickness of 1 mm, a diameter of 12 mm, a (000-1) just plane and a threading dislocation density of $5.5 \times 10^3/cm^2$ formed by a sublimation process.

The top face of the seed crystal substrate 14 was bonded to about the center section of the end face of the seed crystal holding shaft 12 by using a graphite adhesive, with the bottom face of the seed crystal substrate 14 as the (000-1) face. The seed crystal holding shaft 12 and seed crystal substrate 14 were situated so that the seed crystal holding shaft 12 passed through an opening 28 with a diameter of 20 mm, opened at the heat-insulating material 18 and the top of the cover 20 at the top section of the graphite crucible. The gap between the crucible 10 and the seed crystal holding shaft 12 at the opening 28 was 4.0 mm.

Next, the seed crystal holding shaft 12 holding the seed crystal substrate 14 was lowered, the seed crystal substrate 14 was contacted with the Si—C solution 24 so that the bottom face of the seed crystal substrate 14 matched the surface location of the Si—C solution 24, and the bottom face of the seed crystal substrate 14 was wetted with the Si—C solution 24. The seed crystal substrate 14 was then raised so that the bottom face of the seed crystal substrate 14 was positioned 1.0 mm above the liquid surface level of the Si—C solution 24, forming a meniscus of the Si—C solution, and the SiC crystal was grown for 1 hour.

During the crystal growth, the seed crystal holding shaft 12 was rotated at a speed of 150 rpm so that the outer peripheral section of the bottom face of the seed crystal substrate 14 rotated at a speed of 94.2 mm/sec, and the rotational direction was periodically switched, with the rotation holding time during which the seed crystal substrate 14 was continuously rotated in the same direction as 15 seconds, and the stopping time for the seed crystal substrate 14 during switching of the rotational direction as 5 seconds.

Upon completion of the crystal growth, the graphite shaft was raised, and the seed crystal and the SiC crystal grown from the seed crystal were severed from the Si—C solution and the graphite shaft and were recovered. The obtained grown crystal was a SiC single crystal, the diameter of the grown crystal was 12 mm, the thickness at the center of the growth surface was 1.96 mm, and the growth rate of the SiC single crystal was 1.96 mm/hr.

Figure 5:
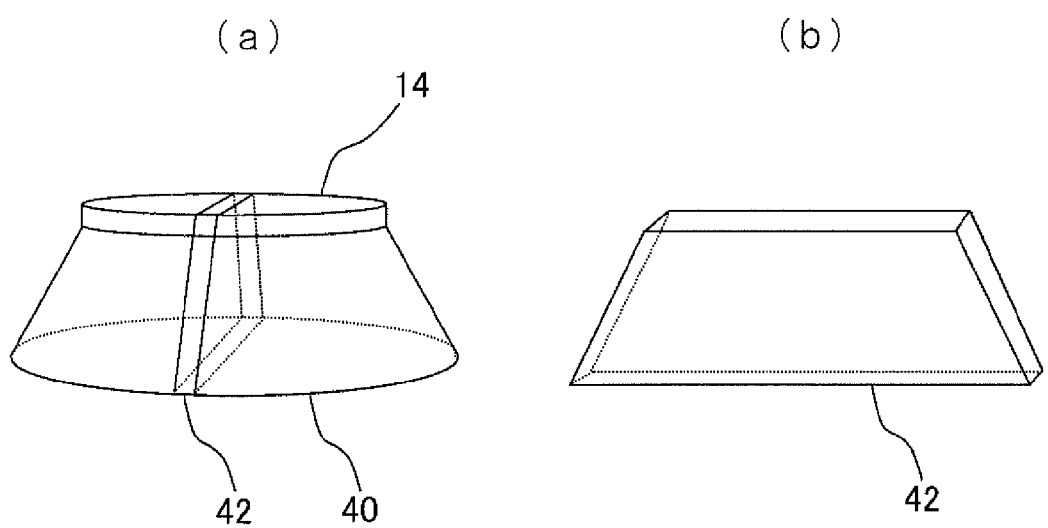
FIG. 5 is a pair of schematic diagrams showing the locations where a grown crystal is cut when examining the presence of inclusions in the grown crystal.
Figure 7:
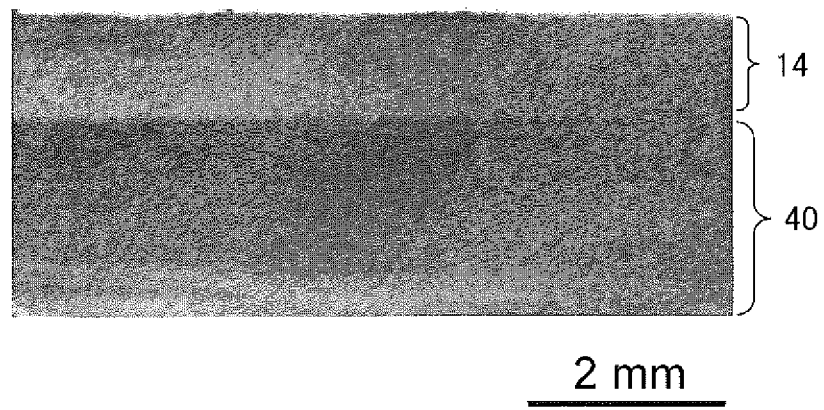
FIG. 7 is an optical microscope photograph of a cross-section of a SiC ingot containing a SiC single crystal grown in Example 1 and a seed crystal substrate.

As shown in FIG. 5, the obtained SiC single crystal was cut parallel to the growth direction to a thickness of 1 mm together with the seed crystal substrate 14, so that the center section of the growth plane was included, and subjected to mirror polishing, and the cross-section of the cut grown crystal was observed under an optical microscope in transparent mode. FIG. 7 shows an optical microscope photograph of a cross-section of a SiC ingot containing the SiC single crystal grown in this example and the seed crystal substrate.

The grown SiC single crystal exhibited no black sections and contained no inclusions, throughout a wide 8 mm diameter range.

Figure 8:
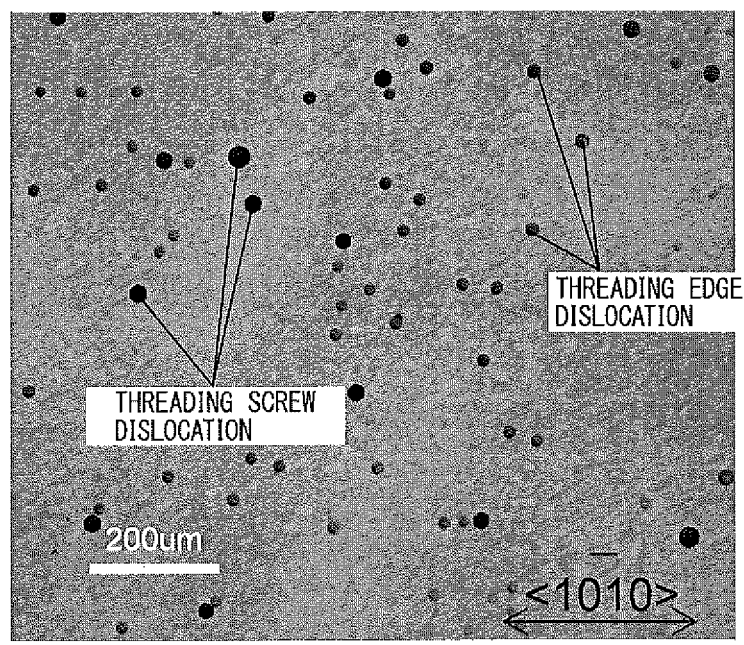
FIG. 8 is a photomicrograph of an etching surface of a SiC single crystal grown in Example 1.

The obtained grown crystal was cut out from the growth surface to a thickness of 0.5 mm, and the (0001) plane of the cut out grown crystal was mirror polished and subjected to alkali etching using molten KOH at 510° C. The etching surface was observed with a microscope. FIG. 8 shows a photomicrograph of the etching surface. The number of etch pits seen in FIG. 8 were counted, and the threading dislocation density of the grown crystal was measured. The threading dislocation density was $5.5 \times 10^3/cm^2$, which was the same as the dislocation density of the seed crystal substrate, confirming virtually no new creation of dislocations.

Example 1-2

A SiC single crystal was grown under the same conditions as Example 1 to evaluate the reproducibility. It was confirmed that a SiC single crystal growth rate of 1.92 mm/hr was obtained, and a grown SiC single crystal had a dislocation density equivalent to that of the seed crystal substrate and contained no inclusions, throughout an 8 mm diameter range.

Example 2

Crystal growth was carried out under the same conditions as Example 1, except that the crucible was positioned 1 mm below the position of the crucible in Example 1 while keeping the temperature of the liquid surface level of the Si—C solution at 2000° C., and a temperature gradient of 50° C./cm was formed between the liquid surface level of the Si—C solution and a location at a 10 mm depth in the vertical direction from the liquid surface level of the Si—C solution 24 toward the interior of the solution. The growth rate of the SiC single crystal was 1.72 mm/hr.

Inclusions in a grown crystal were observed and the dislocation density was measured, in the same manner as Example 1. It was confirmed that a grown SiC single crystal contained no inclusions and had a dislocation density equivalent to that of the seed crystal substrate, throughout an 8 mm diameter range.

Example 3

Crystal growth was carried out under the same conditions as Example 1, except for positioning the crucible 5 mm below the position of the crucible in Example-1 while keeping the temperature of the liquid surface level of the Si—C solution at 2000° C., and forming a temperature gradient of 47° C./cm between the liquid surface level of the Si—C solution and a location at a 10 mm depth in the vertical direction from the liquid surface level of the Si—C solution 24 toward the interior of the solution. The growth rate of the SiC single crystal was 1.27 mm/hr.

Inclusions in a grown crystal were observed and the dislocation density was measured, in the same manner as Example 1. It was confirmed that a grown SiC single crystal contained no inclusions and had a dislocation density equivalent to that of the seed crystal substrate, throughout an 8 mm diameter range.

(Reference Examples 1 to 5)

In Reference Examples 1 to 5, crystal growth was performed under the same conditions as Example 1, except that the crucible was situated with respect to the high-frequency coil 22 in such a manner as to produce each of the temperature gradients listed in Table 1, while keeping the temperature of the liquid surface level of the Si—C solution at 2000° C. The SiC single crystal growth rates shown in Table 1 were obtained.

Inclusions in the SiC single crystals grown in Reference Examples 1 to 5 were observed and the dislocation densities were measured, in the same manner as Example 1. It was confirmed that a grown SiC single crystal contained no inclusions and had a dislocation density equivalent to that of the seed crystal substrate, throughout an 8 mm diameter range.

(Comparative Example 1)

For Comparative Example 1, a SiC single crystal was grown under the same conditions as Example 1, except that a graphite crucible 10 with a depth of 120 mm and an inner diameter of 70 mm (crucible depth/crucible inner diameter=1.71) was used, the temperature gradient was measured varying the vertical position of the crucible with respect to the center of heat release of the high-frequency coil 22, and the crucible was placed at a position where the temperature gradient was at maximum, while keeping the temperature at the surface of the Si—C solution 24 at 2000° C., forming a temperature gradient of 42° C./cm in the surface region of the Si—C solution.

Upon completion of the crystal growth, the graphite shaft was raised, and the seed crystal and the SiC crystal grown from the seed crystal were severed from the Si—C solution and the graphite shaft and were recovered. The obtained grown crystal was a SiC single crystal, the diameter of the grown crystal was 12 mm, the thickness at the center of the growth surface was 0.57 mm, and the growth rate of the SiC single crystal was 0.57 mm/hr.

Inclusions in the SiC single crystal grown in Comparative Example 1 were observed and the dislocation density was measured, in the same manner as Example 1. It was confirmed that a grown SiC single crystal contained no inclusions and had a dislocation density equivalent to that of the seed crystal substrate, throughout an 8 mm diameter range.

(Comparative Examples 2 to 12)

For Comparative Examples 2 to 12, crystal growth was performed under the same conditions as Example 1, except that the crucible was situated with respect to the high-frequency coil 22 in such a manner as to produce each of the temperature gradients listed in Table 1, while keeping the liquid surface level temperature of the Si—C solution at 2000° C., and the SiC single crystal growth rates shown in Table 1 were obtained.

Inclusions in the SiC single crystal grown in Comparative Examples 2 to 12 were observed and the dislocation density was measured, in the same manner as Example 1. It was confirmed that a grown SiC single crystal contained no inclusions and had a dislocation density equivalent to that of the seed crystal substrate, throughout an 8 mm diameter range.

Table 1 shows the temperature gradient in the surface region of the Si—C solution and the SiC single crystal growth rate, for each of the Si—C solutions obtained in Examples 1 to 3, Reference Examples 1 to 5 and Comparative Examples 1 to 12.

TABLE 1

|  | Temperature gradient (° C./cm) | SiC single crystal growth rate (mm/hr) | |
| --- | --- | --- | --- |
|  |  | Crucible with depth/inner diameter = 1.14 | Crucible with depth/inner diameter = 1.71 |
| Example 1-1 | 57 | 1.96 |  |
| Example 1-2 | 57 | 1.92 |  |
| Example 2 | 50 | 1.72 |  |
| Example 3 | 47 | 1.27 |  |
| Ref. Ex. 1 | 42 | 0.91 |  |
| Ref. Ex. 2 | 40 | 1.02 |  |
| Ref. Ex. 3 | 36 | 1.00 |  |
| Ref. Ex. 4 | 32 | 0.93 |  |
| Ref. Ex. 5 | 22 | 0.75 |  |
| Comp. Ex. 1 | 42 |  | 0.57 |
| Comp. Ex. 2 | 41 |  | 0.63 |
| Comp. Ex. 3 | 28 |  | 0.45 |
| Comp. Ex. 4 | 27 |  | 0.41 |
| Comp. Ex. 5 | 22 |  | 0.56 |
| Comp. Ex. 6 | 17 |  | 0.40 |
| Comp. Ex. 7 | 13 |  | 0.25 |
| Comp. Ex. 8 | 12 |  | 0.22 |
| Comp. Ex. 9 | 11 |  | 0.22 |
| Comp. Ex. 10 | 10 |  | 0.19 |
| Comp. Ex. 11 | 5 |  | 0.22 |
| Comp. Ex. 12 | 4 |  | 0.14 |

Figure 9:
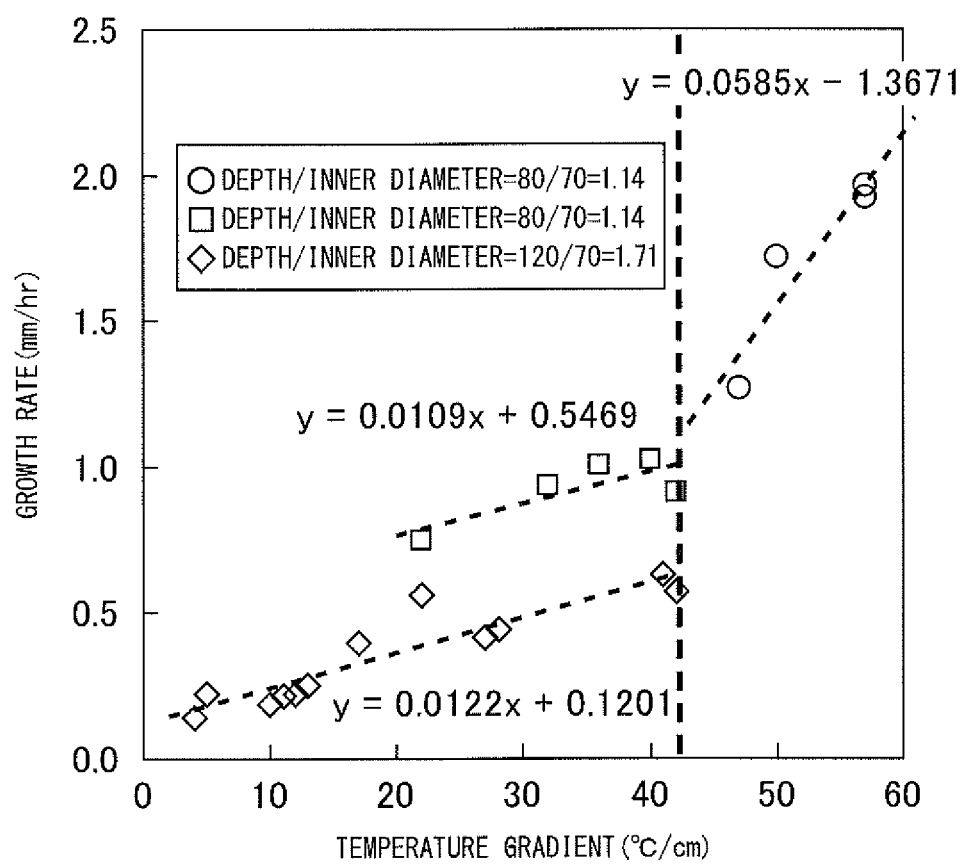
FIG. 9 is a graph plotting SiC single crystal growth rate with respect to temperature gradient in the surface region of each of the Si—C solutions obtained in Examples 1 to 3, Reference Examples 1 to 5 and Comparative Examples 1 to 12.

FIG. 9 shows a graph plotting SiC single crystal growth rate with respect to temperature gradient in the surface region of the Si—C solution, obtained for each of Examples 1 to 3, and Comparative Examples 1 to 17. The dotted line drawn in each plot is an approximation line calculated by the least-square method. The slope of the approximation line for the data obtained in Examples 1 to 3 was 0.0585, the slope of the approximation line for the data obtained in Reference Examples 1 to 5 was 0.0109, and the slope of the approximation line for the data obtained in Comparative Examples 1 to 12 was 0.0122.

When using a crucible with a crucible depth/crucible inner diameter dimensional proportion of 1.14, a higher SiC single crystal growth rate was obtained with the same temperature gradient, compared to using a crucible with a crucible depth/crucible inner diameter dimensional proportion of 1.71. A very high SiC single crystal growth rate was obtained in the region where the temperature gradient in the surface region of the Si—C solution was greater than 42° C./cm.

EXPLANATION OF SYMBOLS

100 Single crystal production apparatus
10 Crucible
12 Seed crystal holding shaft
14 Seed crystal substrate
16 Crucible height
17 Crucible inner diameter
18 Heat-insulating material
20 Cover at top of crucible
22 High-frequency coil
22A Upper level high-frequency coil 22B Lower level high-frequency coil
24 Si—C solution
26 Quartz tube
28 Opening at top of crucible
34 Meniscus
40 SiC grown crystal
42 Cut grown crystal

What is claimed is:

1. A method for producing a SiC single crystal in which a seed crystal substrate is contacted with a Si—C solution that is placed in a crucible and has a temperature gradient such that the temperature decreases from the interior toward the liquid surface level to cause crystal growth of the SiC single crystal, wherein:
the crucible has a cover at the top of the crucible and the depth/inner diameter ratio of the crucible is less than 1.71,
the side wall of the crucible is heated by a heater situated surrounding the crucible, and
the temperature gradient in the range from the liquid surface level of the Si—C solution to 10 mm below the liquid surface level is greater than 47° C./cm.

2. The method for producing a SiC single crystal according to claim 1, wherein the temperature gradient is 50° C./cm or greater.

3. The method for producing a SiC single crystal according to claim 1, wherein the temperature gradient is 57° C./cm or greater.

4. The method for producing a SiC single crystal according to claim 1, wherein the depth/inner diameter ratio of the crucible is no greater than 1.14.

5. The method for producing a SiC single crystal according to claim 2, wherein the depth/inner diameter ratio of the crucible is no greater than 1.14.

6. The method for producing a SiC single crystal according to claim 3, wherein the depth/inner diameter ratio of the crucible is no greater than 1.14.

* * * * *